(12) United States Patent
Ochiai et al.

(10) Patent No.: US 7,394,238 B2
(45) Date of Patent: Jul. 1, 2008

(54) HIGH FREQUENCY DELAY CIRCUIT AND TEST APPARATUS

(75) Inventors: Katsumi Ochiai, Tokyo (JP); Takashi Sekino, Tokyo (JP)

(73) Assignee: Advantest Corporation, Tokyo (JP)

( * ) Notice: Subject to any disclaimer, the term of this patent is extended or adjusted under 35 U.S.C. 154(b) by 85 days.

(21) Appl. No.: 11/101,157

(22) Filed: Apr. 7, 2005

(65) Prior Publication Data

US 2005/0225330 A1    Oct. 13, 2005

Related U.S. Application Data

(63) Continuation of application No. PCT/JP2004/017553, filed on Nov. 26, 2004.

(30) Foreign Application Priority Data

Nov. 28, 2003    (JP)    ............................ 2003-398817

(51) Int. Cl.
*H03H 11/26* (2006.01)
*G01R 27/28* (2006.01)

(52) U.S. Cl. .................... 324/76.35; 324/617; 324/621; 324/76.59; 327/261; 327/172

(58) Field of Classification Search ............. 324/76.35, 324/617, 621, 76.53, 76.54, 76.59
See application file for complete search history.

(56) References Cited

U.S. PATENT DOCUMENTS

| | | | | |
|---|---|---|---|---|
| 3,986,113 A | * | 10/1976 | Vifian | ......................... 324/85 |
| 4,374,358 A | * | 2/1983 | Hirose | ..................... 324/76.58 |
| 4,710,705 A | * | 12/1987 | Kawabata | ................... 324/102 |
| 5,179,438 A | * | 1/1993 | Morimoto | ................... 348/536 |
| 6,351,756 B1 | * | 2/2002 | Taniyoshi | ................... 708/103 |

FOREIGN PATENT DOCUMENTS

| | | |
|---|---|---|
| JP | 51-60138 | 5/1976 |
| JP | 4-145793 | 5/1992 |
| JP | 09-064702 | 3/1997 |
| JP | 10-163830 | 6/1998 |
| JP | 2001-016097 | 1/2001 |

(Continued)

OTHER PUBLICATIONS

Patent Abstracts of Japan, Publication No. 04-145793 dated May 19, 1992, 1 page.

(Continued)

*Primary Examiner*—Diego Gutierrez
*Assistant Examiner*—John Zhu
(74) *Attorney, Agent, or Firm*—Osha Liang LLP

(57) ABSTRACT

A high frequency delay circuit operable to output a high frequency signal delayed for a desired delay time. The high frequency delay circuit includes: a variable delay circuit operable to receive a reference signal of which a frequency is lower than the high frequency signal, and to output a delay reference signal delayed from the reference signal for the desired delay time in advance; and a multiplier operable to generate the high frequency signal, of which a frequency is a frequency of the delay reference signal multiplied by a predetermined value, and to output the generated high frequency signal at timing according to a phase of the delay reference signal.

7 Claims, 8 Drawing Sheets

FOREIGN PATENT DOCUMENTS

JP            2001-251184        9/2001

OTHER PUBLICATIONS

Patent Abstracts of Japan, Publication No. 2001-251184 dated Sep. 14, 2001, 1 page.
Patent Abstracts of Japan, Publication No. 2001-016097 dated Jan. 19, 2001, 1 page.
Patent Abstracts of Japan, Publication No. 10-163830 dated Jun. 19, 1998, 1 page.
Patent Abstracts of Japan, Publication No. 09-064702 dated Mar. 7, 1997, 1 page.
International Search Report issued in PCT/JP2004/17553, mailed Jan. 11, 2005, 4 pages.

* cited by examiner

HIGH FREQUENCY DELAY CIRCUIT AND TEST APPARATUS

The present application is a continuation application of PCT/JP2004/017553 filed on Nov. 26, 2004 which claims priority from a Japanese Patent Application No. 2003-398817 filed on Nov. 28, 2003, the contents of which are incorporated herein by reference.

BACKGROUND OF THE INVENTION

1. Field of the Invention

The present invention relates to a high frequency delay circuit which delays a high frequency signal to a desired phase. More particularly, the present invention relates to a high frequency delay circuit used for a test apparatus operable to test an electronic device.

2. Description of the Related Art

Conventionally, a test apparatus for testing an electronic device includes a pattern generator which generates a test pattern used for a test of the electronic device, a waveform shaper which forms the test pattern, and timing generator which generates timing at which the test pattern formed by the waveform shaper is to be output. For example, timing generator generates a clock having a predetermined frequency and a predetermined phase based on the reference clock, and the waveform shaper forms the test pattern according to the clock generated by the timing generator and outputs it.

At this time, timing generator needs to generate the clock having the same frequency as the frequency of the test pattern which is to be supplied to the electronic device. On the other hand, with improvement in the speed of the electronic device of these days, it is necessary to use the high frequency for the test pattern to be supplied. Therefore, also in the timing generator, it is necessary to control the higher frequency clock to a desired phase and to output it.

Conventionally, there are some devices which generate the clock having desired frequency by PLL (Phase Lock Loop) as a timing generator, delay the generated high frequency clock to the desired phase, and output it.

As mentioned above, the conventional timing generator generates the high frequency clock and delays the generated high frequency clock by a delay circuit. However, it is difficult to delay a high frequency clock. For example, in case that the clock is to be delayed using rounding of the edges of the clock, it is difficult to sufficiently delay each edge when the rise time of the clock or the like becomes short. Therefore, it is more difficult to delay the high frequency signal compared with a low frequency clock.

SUMMARY OF THE INVENTION

Therefore, it is an object of the present invention to provide a high frequency delay circuit and a test apparatus which overcome the above problems. This object is achieved by combinations described in the independent claims. The dependent claims define further advantageous and exemplary combinations of the present invention.

To solve the foregoing problem, according to a first aspect of the present invention, there is provided a high frequency delay circuit operable to output a high frequency signal delayed for a desired delay time. The high frequency delay circuit includes: a variable delay circuit operable to receive a reference signal of which a frequency is lower than the high frequency signal, and to output a delay reference signal delayed from the reference signal for the desired delay time in advance; and a multiplier operable to generate the high frequency signal, of which a frequency is a frequency of the delay reference signal multiplied by a predetermined value, and to output the generated high frequency signal at timing according to a phase of the delay reference signal.

The multiplier may include: a phase comparator operable to output a control voltage according to a phase difference between the delay reference signal and a comparison signal; a voltage controlled oscillator operable to generate the high frequency signal having a frequency according to the control voltage; and a divider operable to divide the high frequency signal generated by the voltage controlled oscillator, to generate a signal, of which a frequency is substantially the same as that of the delay reference signal, and to input the signal into the phase comparator as the comparison signal.

The multiplier may include: a pulse width extension circuit operable to output logical sum of the delay reference signal and a signal, which is the delay reference signal delayed for a delay time shorter than a pulse width of the delay reference signal, as a pulse width extension signal; and a multiplication circuit operable to output logical product of the pulse width extension signal and a signal, which is an inversion of the pulse width extension signal delayed for a predetermined delay time, as the high frequency signal.

The multiplier may include: a first variable delay units group including a plurality of variable delay units, wherein a delay time of each of the variable delay units is set to be ½ cycle of the high frequency signal to be generated, the variable delay units sequentially delay the delay reference signal and output it, and the variable delay units are connected by cascade connection; and a plurality of AND circuits operable to generate logical products of inverted signals of signals output from even number variable delay units out of the plurality of variable delay units, and signals output from odd number variable delay units out of the plurality of variable delay units; and an OR circuit operable to output logical sum of signals output from the plurality of AND circuits as the high frequency signal.

The multiplier may further include: a second variable delay units group including a plurality of variable delay units, wherein a delay time of each of the plurality of variable delay units of the second variable delay units group is set to be substantially the same as that of each of the plurality of variable delay units of the first variable delay units group, each of the plurality of variable delay units of the second variable delay units group sequentially delays the high frequency signal for ½ cycle of the high frequency signal and outputs it, and the plurality of variable delay units of the second variable delay units group are connected by cascade connection; and a wave adder operable to add waves of the signals output from the variable delay units of the second variable delay units group, and to define timing of each edge of the high frequency signal based on an average of delay times in the plurality of variable delay units of the first variable delay units group and the second variable delay units group.

The multiplier may further include: an exclusive OR circuit operable to output an exclusive OR of the delay reference signal input into one of the variable delay units of the first variable delay units group, and the delay reference signal output from the above-mentioned variable delay unit; and a duty comparator operable to detects a duty ratio of the signal output from the exclusive OR circuit, and to control a delay time of each of the variable delay units so that the detected duty ratio may become about 50%.

The high frequency delay circuit may output the high frequency signal, of which a frequency is double precision of the frequency of the reference signal, and the multiplier may include: a first variable delay unit operable to delay the delay reference signal for ¼ cycle of the delay reference signal and to output it; a second variable delay unit operable to delay a signal output from the first variable delay unit for ¼ cycle of the delay reference signal and to output it; a third variable delay unit operable to delay a signal output from the second variable delay unit for ¼ cycle of the delay reference signal and to output it; a first AND circuit operable to output logical product of an inverted signal of the delay reference signal, and a signal output from the first variable delay unit; a second AND circuit operable to output logical product of an inverted signal of a signal output from the second variable delay unit outputs, and a signal output from the third variable delay unit; and an OR circuit operable to output logical sum of a signal output from the first AND circuit, and a signal output from the second AND circuit, as the high frequency signal.

The multiplier may further include: a fourth variable delay unit operable to delay the high frequency signal output from the OR circuit for ¼ cycle of the delay reference signal and to output it; a fifth variable delay unit operable to delay a signal output from the fourth variable delay unit for ¼ cycle of the delay reference signal and to output it; a sixth variable delay unit operable to delay a signal output from the fifth variable delay unit for ¼ cycle of the delay reference signal and to output it; and a wave adder operable to add waves of signals output from the OR circuit, the fourth variable delay unit, the fifth variable delay unit, and the sixth variable delay unit, and to output the high frequency signal, of which jitters are reduced.

The multiplier may further include: an exclusive OR circuit operable to output an exclusive OR of the delay reference signal to be input into either of the first variable delay unit, the second variable delay unit, or the third variable delay unit, and the delay reference signal output from the above-mentioned variable delay unit; and a duty comparator operable to detect a duty ratio of the signal output from the exclusive OR circuit, and to set a delay time of the first variable delay unit, the second variable delay unit, and the third variable delay unit so that the detected duty ratio may become about 50%.

According to a second aspect of the present invention, there is provided a high frequency delay circuit operable to outputs a high frequency signal delayed for a desired delay time. The high frequency delay circuit includes: a phase comparator operable to receive a reference signal of which a frequency is lower than the high frequency signal, and to output a control voltage according to a phase difference between the reference signal and a comparison signal; a voltage superpose section operable to output a superpose voltage, wherein the superpose voltage is the control voltage output from the phase comparator being superposed with a delay voltage according to the desired delay time; a voltage controlled oscillator operable to generate the high frequency signal having a frequency according to the superpose voltage; and a divider operable to divide the high frequency signal generated by the voltage controlled oscillator, to generate a signal of which a frequency is substantially the same as the frequency of the reference signal, and to input it into the phase comparator as the comparison signal.

According to a third aspect of the present invention, there is provided a test apparatus operable to test an electronic device. The test apparatus includes: a pattern generator operable to generate a test pattern for testing the electronic device; a high frequency delay circuit operable to generate a high frequency clock, of which a frequency is higher than the reference clock, and of which a phase is delayed for a desired delay time, based on the supplied reference clock; and a wave shaping section operable to form the test pattern according to the high frequency clock, and to supply it to the electronic device, wherein the high frequency delay circuit includes: a variable delay circuit operable to receive the reference clock and to output a delay clock delayed from the reference clock for the desired delay time in advance; and a multiplier operable to generate the high frequency clock, of which a frequency is a frequency of the delay clock multiplied by a predetermined value, and to output the generated high frequency clock at timing according to a phase of the delay clock.

A plurality of the high frequency delay circuits may be provided according to a plurality of pins of the electronic device to which the test pattern is to be supplied, and the test apparatus may further include a jitter reduction circuit operable to reduce a jitter of the reference clock and to supply it to the plurality of high frequency delay circuits.

According to a fourth aspect of the present invention, there is provided a test apparatus operable to test an electronic device. The test apparatus includes: a pattern generator operable to generate a test pattern for testing the electronic device; a high frequency delay circuit operable to generate a high frequency clock having a desired phase, of which a frequency is higher than the reference clock based on the supplied reference clock; and a wave shaping section operable to form the test pattern according to the high frequency clock, and to supply it to the electronic device, wherein the high frequency delay circuit includes: a phase comparator operable to receive a reference signal of which a frequency is lower than the high frequency signal, and to output a control voltage according to a phase difference between the reference signal and a comparison signal; a voltage superpose section operable to output a superpose voltage, wherein the superpose voltage is the control voltage output from the phase comparator being superposed with a delay voltage according to the desired delay time; a voltage controlled oscillator operable to generate the high frequency signal having a frequency according to the superpose voltage; and a divider operable to divide the high frequency signal generated by the voltage controlled oscillator, to generate a signal of which a frequency is substantially the same as the frequency of the reference signal, and to input it into the phase comparator as the comparison signal.

This summary of the invention does not necessarily describe all necessary features of the present invention. The present invention may also be a sub-combination of the above-described features. The above and other features and advantages of the present invention will become more apparent from the following description of embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
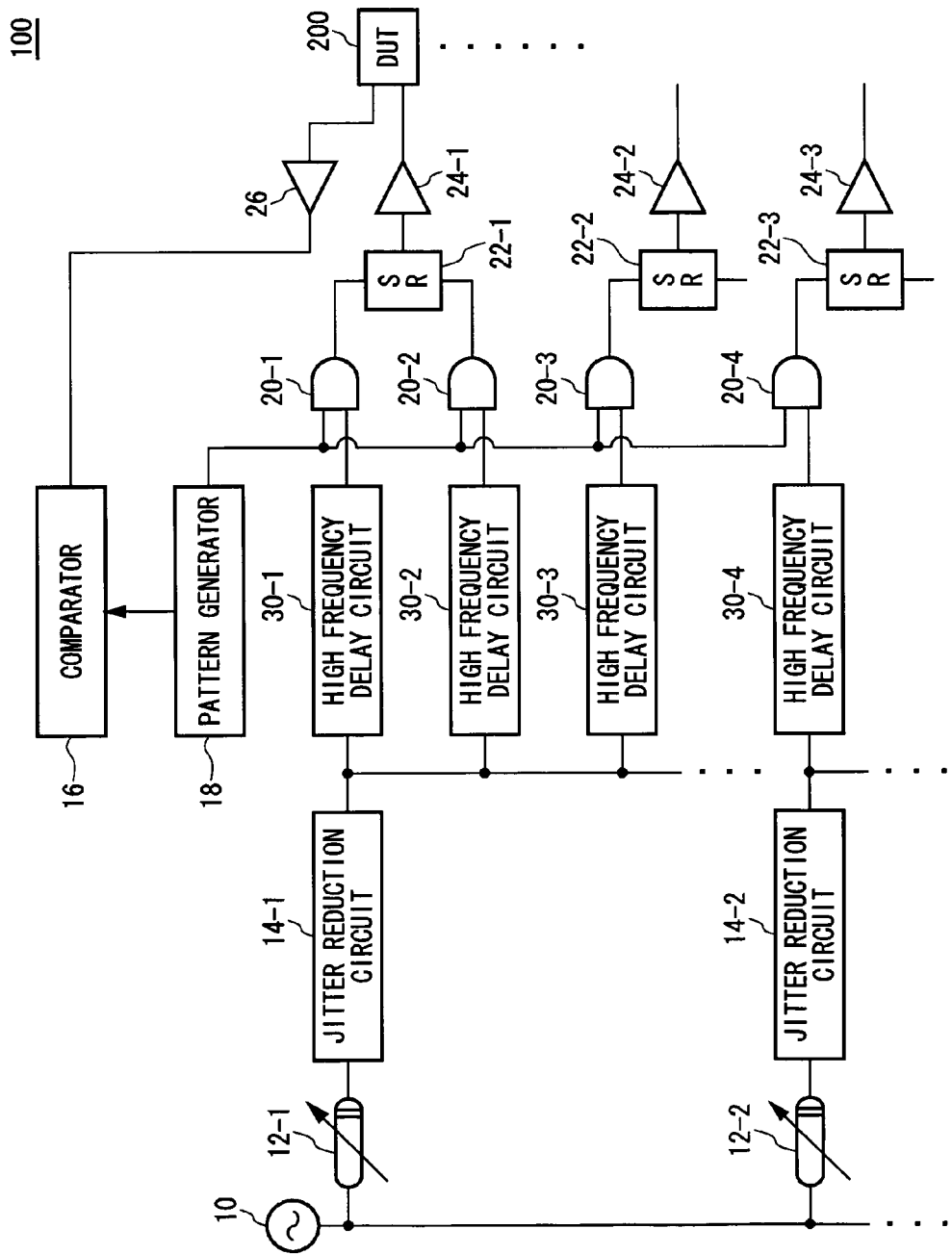
FIG. 1 is a block diagram exemplary showing a configuration of a test apparatus according to an embodiment of the present invention.

FIG. 1 is a block diagram exemplary showing a configuration of a test apparatus 100 according to an embodiment of the present invention. A test apparatus 100 is an apparatus operable to test an electronic device 200, such as a semiconductor element. According to this example, the test apparatus 100 includes: a reference clock generator 10; a plurality of variable delay circuits 12-1~12-2 (to be collectively referred to as 12); a plurality of jitter reduction circuits 14-1~14-2 (to be collectively referred to as 14); a comparator 16; a pattern generator 18: a plurality of high frequency delay circuits 30-1~30-4 (to be collectively referred to as 30); a plurality of AND circuits 20-1~20-4 (to be collectively referred to as 20); a plurality of set reset latches 22-1~22-3 (to be collectively referred to as 22); a driver 26; and a plurality of comparators 24-1~24-3 (to be collectively referred to as 24).

For example, the reference clock generator 10 is a crystal oscillator which generates a reference clock having a predetermined frequency. Here, the reference clock is an example of the reference signal according to the present invention. Moreover, the reference clock generator 10 distributes the reference clock to the plurality of variable delay circuits 12. The plurality of variable delay circuits 12 are provided for a plurality of pins of the electronic device 200, respectively, and delay the distributed reference clock for a predetermined delay time, respectively.

Each jitter reduction circuit 14 is provided corresponding to each variable delay circuit 12. Each of the jitter reduction circuits receives the reference clock delayed by the corresponding variable delay circuit 12, reduces the jitter of the reference clock, and supplies it to the plurality of high frequency delay circuits 30. For example, the jitter reduction circuit 14 a PLL operable to generate a clock having substantially the same frequency as the reference clock based on the received reference clock, and to output it.

The plurality of high frequency delay circuits 30 are provided corresponding to the pins of the electronic device 200 into which the test pattern is to be supplied, and based on the supplied reference clock, a high frequency clock having a desired phase is generated, of which the frequency is higher than the reference clock. Here, the high frequency clock is an example of the high frequency signal according to the present invention. In this example, two high frequency delay circuits 30 are provided for one pin of the electronic device 200. One of the high frequency delay circuits 30 generates a high frequency clock which defines timing of a rising edge of the test pattern, and another high frequency delay circuit 30 generates a high frequency clock which defines timing of a falling edge of the test pattern.

The pattern generator 18 generates the test pattern for testing the electronic device 200, and supplies it to the plurality of AND circuits 20. Moreover, the AND circuits 20 and the set reset latches 22 act as a wave shaping section operable to form the test pattern to be supplied. Each AND circuit 20 is provided corresponding to each high frequency delay circuit 30, and outputs the pattern which is made from the test pattern extracted by the high frequency clock. The set reset latches 22 are provided for every pin of the electronic device 200, generate test signals based on the patterns output from the corresponding two AND circuits 20, and supply them to the pins of the electronic device 200 through the drivers 24.

Moreover, the comparator 16 decides acceptability of the electronic device 200 by receiving the output signal output from the electronic device 200 through the driver 26, and comparing the output signal with an expected value signal output from the pattern generator 18. Since the jitter of the reference clock distributed to the plurality of high frequency delay circuits 30 can be reduced according to the test apparatus 100 in this example, a skew of the high frequency clock output from each high frequency delay circuit 30 can be reduced.

Figure 2:
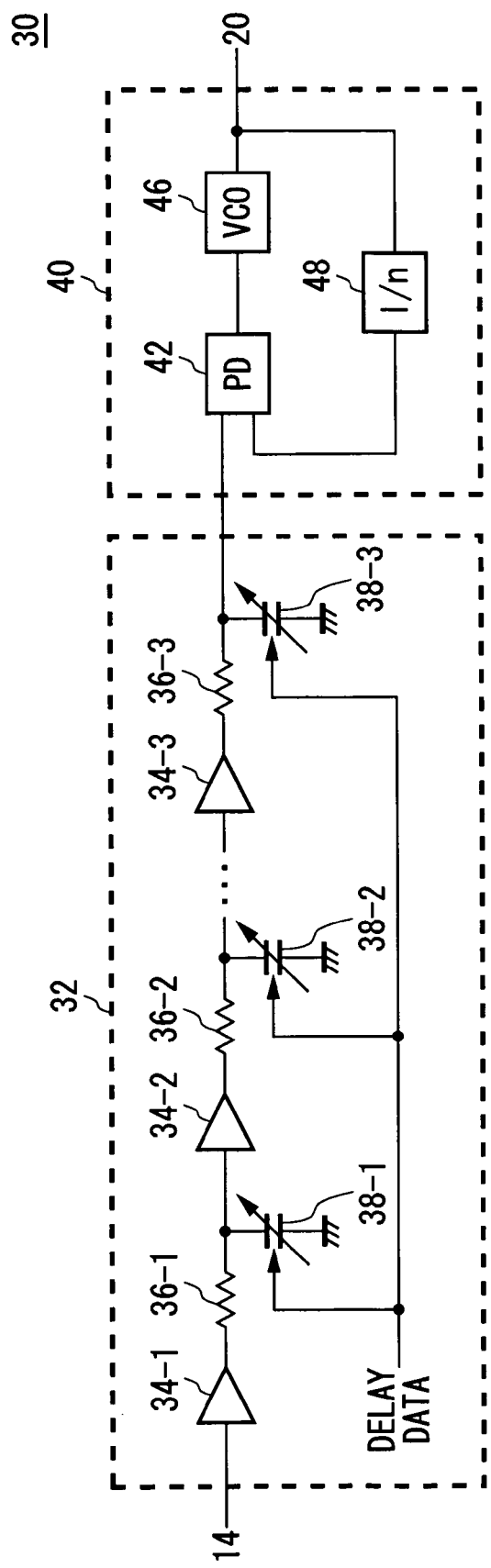
FIG. 2 is a circuit diagram exemplary showing a configuration of a high frequency delay circuit.

FIG. 2 is a circuit diagram exemplary showing a configuration of a high frequency delay circuit 30. The high frequency delay circuit 30 includes a variable delay circuit 32 and a multiplier 40. The variable delay circuit 32 receives a reference clock, of which the frequency is lower than the high frequency signal, from the jitter reduction circuit 14, and outputs the delay clock by which the reference clock is delayed. Here, the delay clock is an example of the delay reference signal according to the present invention.

In this example, the variable delay circuit 32 includes a plurality of buffers 34-1~34-3 (to be collectively referred to as 34), a plurality of resistors 36-1~36-3 (to be collectively referred to as 36), and a plurality of variable capacitors 38-1~38-3 (to be collectively referred to as 38). The plurality of buffers 34 is connected by cascade connection through the resistors 36, and they transfer the reference clock sequentially. Moreover, each variable capacitor 38 is provided corresponding to a resistor 36 and a buffer 34, and is provided between a node of the resistor 36 and a buffer 34, and a ground potential. At this time, delay occurs in the transmitted reference clock by the capacitance of each variable capacitor 38. In this example, the delay time of the reference clock in the variable delay circuit 32 is controlled by controlling the capacitance of each variable capacitor 38 based on the delay data indicating the delay time which is to be applied for the reference clock.

Moreover, the multiplier 40 generates the high frequency clock which is multiplied by the frequency of the delay clock output from the variable delay circuit 32, and outputs the generated high frequency clock at a timing corresponding to the phase of the delay clock. In this example, the multiplier 40 is a PLL and includes a phase comparator 42, a voltage controlled oscillator 46, and a divider 48.

A phase comparator 42 receives a delay clock from the variable delay circuit 32, and outputs a control voltage according to the phase difference between the delay clock and the comparison signal supplied from the divider. Moreover, the voltage controlled oscillator 46 generates the high frequency clock having a frequency according to the control voltage output from the phase comparator 42, and outputs it. Moreover, the divider 48 divides the high frequency clock output from the voltage controlled oscillator 46, generates the signal having substantially the same frequency as the delay clock, and inputs it into the phase comparator 42 as the comparison signal. By such the control, the high frequency clock having the phase according to the phase of the delay clock is generable.

According to the high frequency delay circuit 30 in this example, compared with the high frequency clock which desires to control the phase or the delay time, the phase or the delay time of the high frequency clock is controllable by controlling the phase or the delay time of the low frequency reference clock. Therefore, the phase or the delay time of the high frequency clock is easily controllable.

Figure 3:
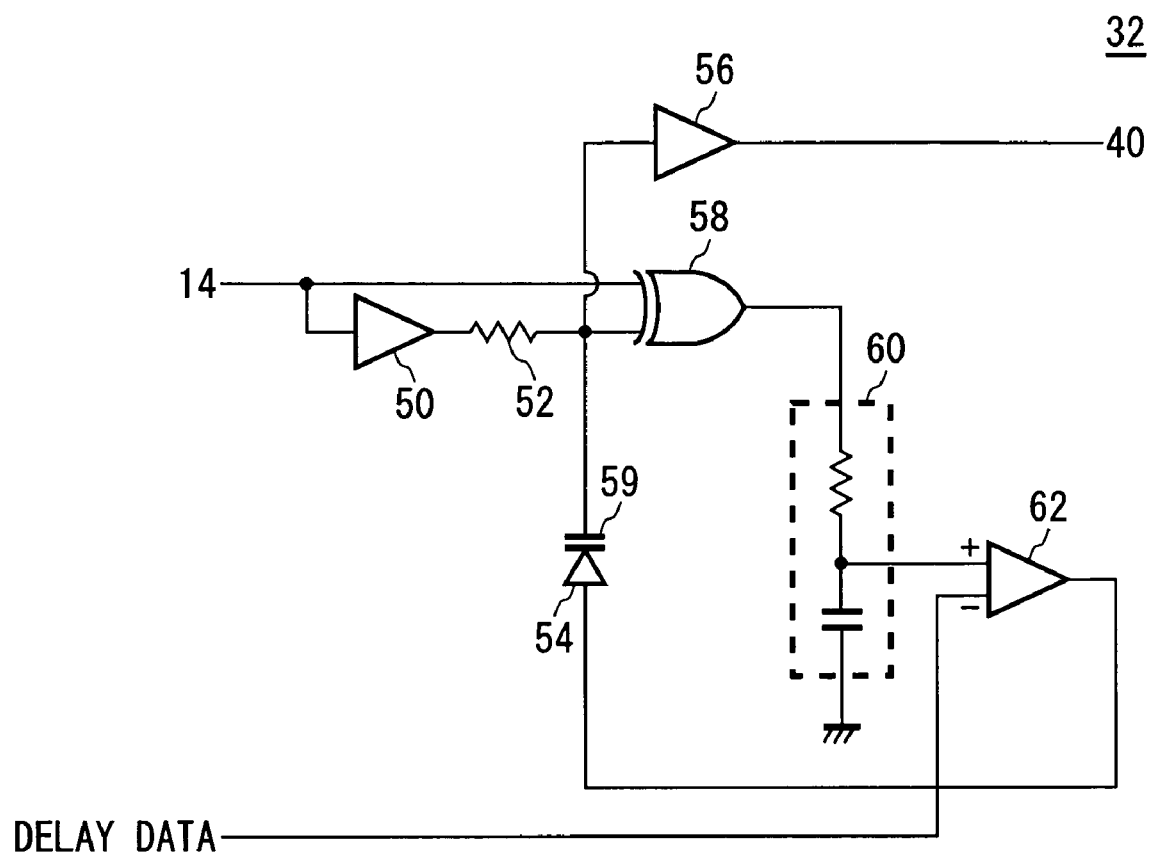
FIG. 3 is a circuit diagram exemplary showing a configuration of a variable delay circuit.

FIG. 3 is a circuit diagram exemplary showing a configuration of the variable delay circuit 32. The variable delay circuit 32 in this example includes a buffer 50, a buffer 54, a buffer 56, a resistor 52, an exclusive OR circuit 58, an integrating circuit 60, and an error amplifier 62.

The buffer 50, the resistor 52, and a capacitor 59 constitute a delay circuit like the circuit explained with reference to FIG. 2. The buffer 50 and the resistor 52 are connected in series to transmit the reference clock. Then, an end of the capacitor 59 is connected to the resistor 52, and the other end is connected to the buffer 54. The reference clock transmitted via the resistor 52 is delayed according to the capacitance of the capacitor 59, and is input into the exclusive OR circuit 58 as a delay clock. Moreover, the delay clock is output to the multiplier 40 through the buffer 56.

The exclusive OR circuit 58 outputs the exclusive OR of the reference clock received from the jitter reduction circuit 14 and the delay clock received through the resistor 52. The integrating circuit 60 integrates the signal output from the exclusive OR circuit 58, and outputs the voltage, which is the average of the signal level.

The error amplifier 62 compares the voltage output from the integrating circuit 60 and the voltage based on the delay data, and supplies the comparison result to another end of the capacitor 59 through the buffer 54. For example, the error amplifier 62 outputs 1 when the voltage output from the integrating circuit 60 is greater than the voltage based on the delay data.

That is, the voltage output from the integrating circuit 60 is settled according to the delay time of the delay clock. Moreover, the capacitance charged in the capacitor 59 can be controlled by the comparison result of that voltage and the voltage based on delay data, and consequently the delay time of the delay clock can be controlled. That is, the delay time of the delay clock is controllable by controlling the delay data.

As explained with reference to FIG. 2 and FIG. 3, as for the high frequency delay circuit 30 in this example, various types of variable delay circuit 32 can be used. That is, since the high frequency clock can be delayed by delaying the low frequency clock, the high frequency delay circuit 30 in this example can employ any type of variable delay circuit 32 which is capable of delaying the low frequency clock. Therefore, the high frequency delay circuit 30 in this example improves the flexibility of the circuitry.

Figure 4:
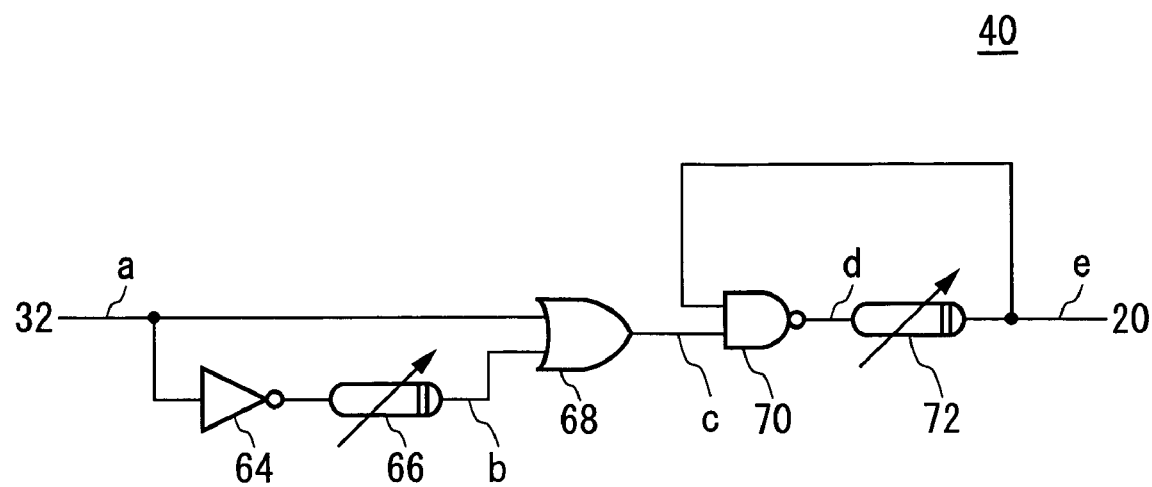
FIG. 4 is a circuit diagram showing another example of a configuration of a multiplier.

FIG. 4 is a circuit diagram showing another example of a configuration of the multiplier 40. In this example, the multiplier 40 includes a buffer 64, a variable delay circuit 66, an OR circuit 68, an AND circuit 70, and a variable delay circuit 72. Operation of the multiplier 40 in this example will be explained using a timing chart.

Figure 5:
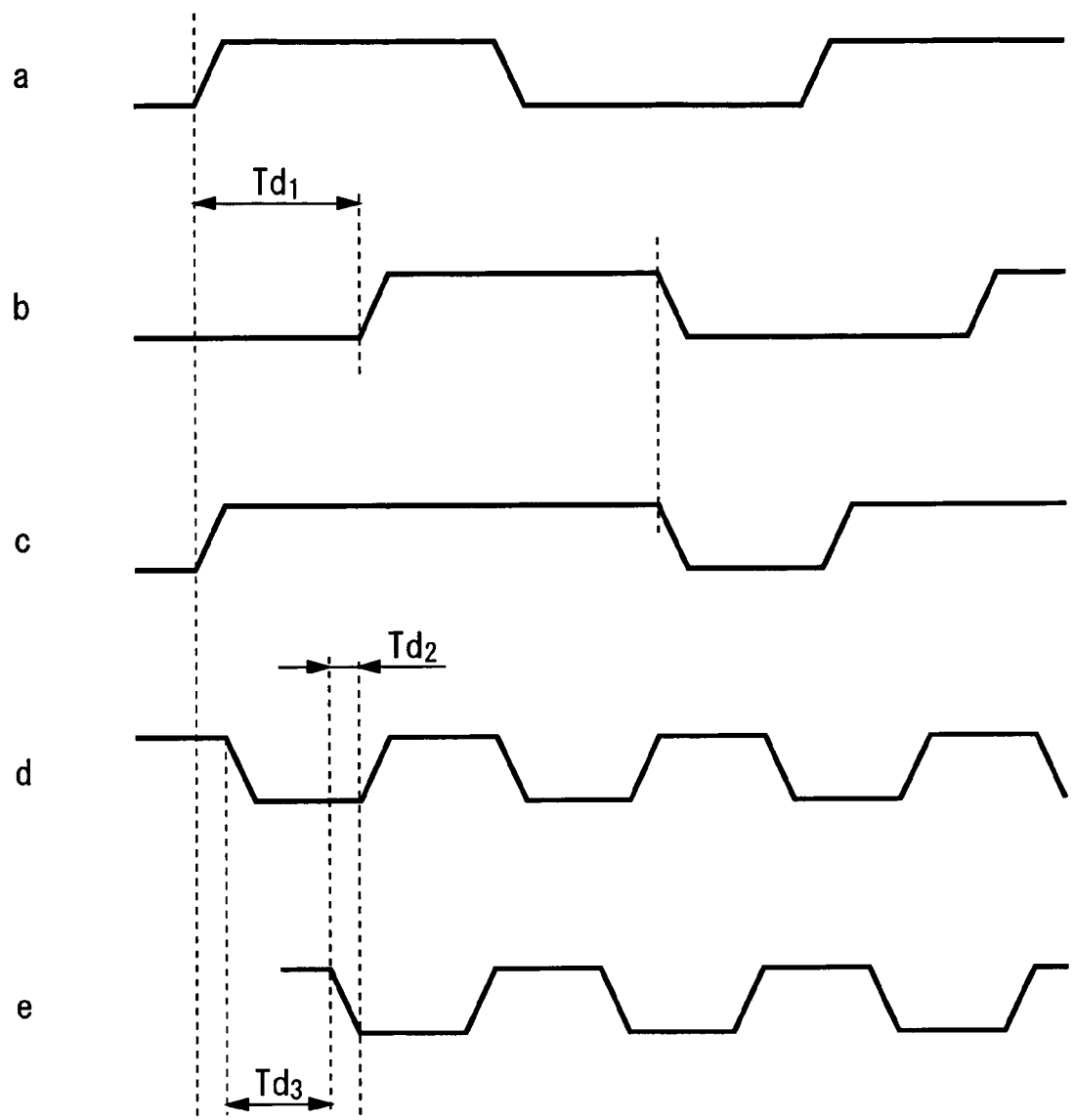
FIG. 5 is a timing chart explaining operation of the multiplier shown in FIG. 4.

FIG. 5 is a timing chart explaining operation of the multiplier 40 shown in FIG. 4. First, the delay clock "a" as shown in FIG. 5 is input into the multiplier 40 from the variable delay circuit 32. The buffer 64 receives the delay clock "a", inverts it, and outputs it. Then, the variable delay circuit 66 outputs the delay clock "b", which is delayed for delay time $Td_1$ from the delayed clock inverted by the buffer 64. At this time, it is preferable that the delay time $Td_1$ is shorter than a pulse width of the delay clock "a".

Then, the OR circuit 68 outputs the logical sum of the delay clock "a" and the delay clock "b". That is, the OR circuit 68 changes the duty ratio of the delay clock "a", and acts as a pulse width extension circuit operable to output a pulse width extension signal "c" of which the pulse width is extended.

Then, the AND circuit 70 acts as a multiplication circuit operable to output the inverted signal of the logical product of the pulse width extension signal "c" and the inverted signal of the pulse width extension signal delayed by the variable delay circuit 72 as a high frequency signal. For example, as shown in FIG. 5, the signal "d" output from the AND circuit 70 becomes an inverted signal of the pulse width extension signal "c", and the falling edge is output. Then, the variable delay circuit 72 outputs the signal "e", which is the signal "d" delayed for a delay time $Td_3$. Since the logical product of the signal "c" and the signal "e" becomes L according to the falling of the signal "e", the signal "d" becomes H. The timing at which the signal "d" becomes H is delayed for a delay time $Td_2$ from the timing of the falling of the signal "e" in the AND circuit 70. Then, the signal "e" becomes H after the delay time $Td_3$ has elapsed from the timing at which the signal "d" became H.

By repeating such the operation, the AND circuit 70 and the variable delay circuit 72 generate a high frequency clock multiplied according to the delay clock. What is necessary is just to set sum $Td_2+Td_3$ of the delay time in the AND circuit 70 and the variable delay circuit 72 to 1/n of a cycle of the delay clock to generate the high frequency clock, of which the frequency is the frequency of the delay clock multiplied by n. In this example, since the delay time of the AND circuit 70 is substantially fixed, the high frequency clock having a desired frequency can be generated by controlling the delay time of the variable delay circuit 72.

Figure 6:
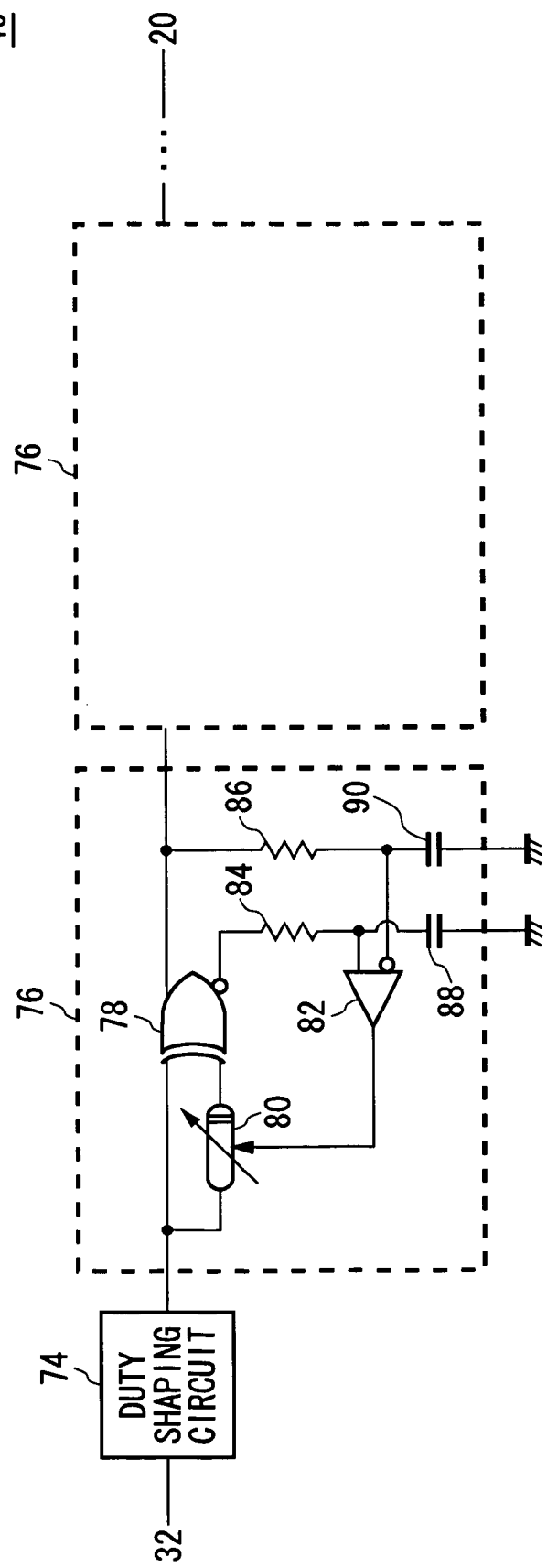
FIG. 6 is a circuit diagram showing yet another example of the multiplier.

FIG. 6 is a circuit diagram showing yet another example of the multiplier 40. The multiplier 40 in this example includes a duty shaping circuit 74 and a plurality of ×2 multiplication circuits. The duty shaping circuit 74 receives the delay clock output from the variable delay circuit 32, and adjusts the duty ratio of the delay clock to 50%.

Each ×2 multiplication circuit 76 is a circuit operable to generate a signal, of which the frequency is the frequency of the received signal multiplied by two. By the cascade connection of the desired number of the ×2 multiplication circuits 76, the high frequency clock having a desired frequency is generable.

Each ×2 multiplication circuit 76 includes a variable delay circuit 80, an exclusive OR circuit 78, a resistor 84, a resistor 86, a capacitor 88, a capacitor 90, and an error amplifier 82. The variable delay circuit 80 receives a delay clock, delays it for ¼ cycle of the delay clock, and outputs it. The exclusive OR circuit 78 outputs the exclusive OR of the delay clock and the delay clock delayed by the variable delay circuit 80, and also outputs the inverted signal of the exclusive OR. Although the exclusive OR of the delay clock and the delay clock delayed by the variable delay circuit 80 is the frequency of the delay clock multiplied by two, the ×2 multiplication circuits in this example detect the duty ratio of the multiplied frequency, and they adjust the delay time in the variable delay circuit 80 so that the detected duty ratio may become 50%.

The non-inverted signal output from the exclusive OR circuit 78 is input into the integrating circuit which consists of the resistor 86 and the capacitor 90. Moreover, the inverted signal output from the exclusive OR circuit 78 is input into the integrating circuit which consists of the resistor 84 and the capacitor 88. At this time, it is preferable that the properties of the resistor 86 and the resistor 84, and the properties of the capacitor 90 and the capacitor 88 are the same as each other, respectively.

Here, the error amplifier 82 adjusts the delay time in the variable delay circuit 80 so that the duty ratio of the signal output from the exclusive OR circuit 78 may become 50%. Since the signal level output from the integrating circuits are the same as each other when the duty ratio of the signal output from the exclusive OR circuit 78 is 50%, the error amplifier 82 does not adjust the delay time of the variable delay circuit 80 in this case. However, when the duty ratio of the signal output from the exclusive OR circuit 78 is not 50%, the error amplifier 82 outputs the voltage according to the difference between the signal levels output from the integrating circuits, and adjusts the delay time of the variable delay circuit 80.

According to the multiplier 40 in this example, the high frequency clock, of which the duty ratio is accurately adjusted to 50%, can be generated.

Figure 7A:
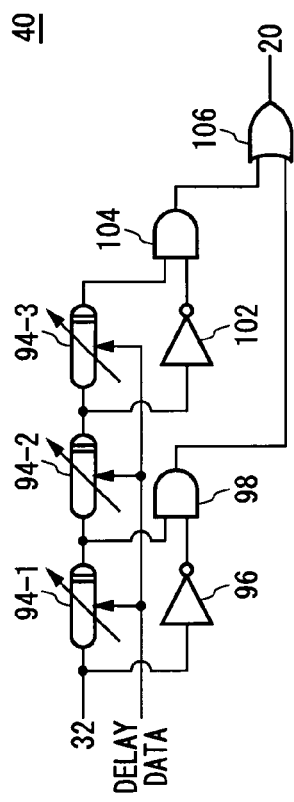
FIG. 7A is a circuit diagram exemplary showing a configuration of the multiplier.

FIG. 7A is a circuit diagram exemplary showing a configuration of the multiplier 40. The multiplier 40 shown in FIG. 7A includes a first variable delay units group which consists of a plurality of variable delay units 94-1~94-3 (to be collectively referred to as 94), a plurality of buffers (96,102), a plurality of AND circuits (98,104), and an OR circuit 106.

The plurality of variable delay units 94 of the first variable delay units group are connected by cascade connection. Moreover, when the multiplier 40 generates the high frequency clock, of which the frequency is the frequency of the delay clock multiplied by n, the number of the variable delay units 94 to be connected will be 2n−1. Moreover, ½ cycle of the high frequency clock to be generated are set up for the delay time for each variable delay unit 94, then the delay clocks are delayed and output sequentially. In this example, each variable delay unit 94 controls the timing of each edge of the high frequency clock to be generated.

In this example, the multiplier 40 outputs the high frequency clock, of which the frequency is the frequency of the delayed clock multiplied by two, and the first variable delay units group consists of: a first variable delay unit 94-1 which delays the delay clock for ¼ cycle of the delay clock and outputs the delay clock; a second variable delay unit 94-2 which delays the delay clock output from the first variable delay unit 94-1 for ¼ cycle of the delay clock and outputs the delay clock; and a third variable delay unit 94-3 which delays the delay clock output from the second variable delay unit 94-2 for ¼ cycle of the delay clock and outputs the delay clock.

The plurality of buffers (98,104) invert the signal output from the even number variable delay unit 94 of the first variable delay units group, and output it. Moreover, the plurality of buffers (98,104) may invert the signal to be input into the odd number variable delay unit 94 of the first variable delay units group, and output it. In this example, the buffer 96 inverts the delay clock to be input into the variable delay unit 94-1 and outputs it, and the buffer 102 inverts the delay clock to be input into the variable delay unit 94-3 and outputs it.

The plurality of AND circuits (98,104) generate the logical product of the inverted signal of the signal output from the even number variable delay unit 94 of the plurality of variable delay units 94, and the signal output from the odd number variable delay unit 94 of the plurality of variable delay units 94. Moreover, the plurality of AND circuits (98,104) may generate the logical product of the inverted signal of the signal input into the odd number variable delay unit 94 of the plurality of variable delay units 94, and the signal input into the even number variable delay unit 94 of the plurality of variable delay units 94. In this example, the AND circuit 98 (a first AND circuit) outputs the logical product of the inverted signal of the delay clock to be input into the variable delay unit 94-1 (a first variable delay unit), and the signal output from the variable delay unit 94-1. The AND circuit 104 (a second AND circuit) outputs the logical product of the inverted signal of the signal output from the variable delay unit 94-2 (a second variable delay unit), and the signal output from the variable delay unit 94-3 (a third variable delay unit).

That is, the AND circuit 98 and the AND circuit 104 output signals, of which the delay clock and the frequency are the same as each other and the pulse width is substantially the half, and outputs the signals, of which the phases are shifted by ½ cycle of the delay clock. In the OR circuit 106, the high frequency clock, of which the frequency is multiplied by two, can be generated by the logical sum of the signals output from the plurality of AND circuits (98,104).

Figure 7B:
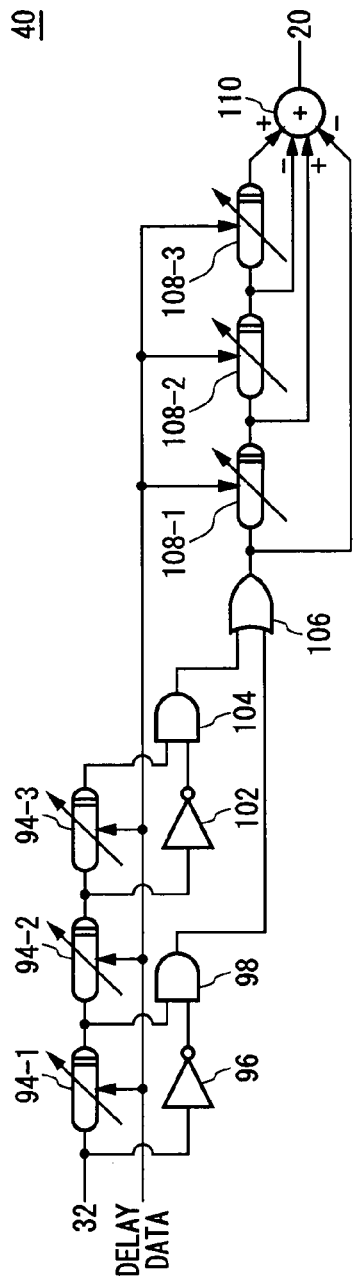
FIG. 7B is a circuit diagram showing another example of the configuration of the multiplier.

FIG. 7B is a circuit diagram showing another example of the configuration of the multiplier. In addition to the configuration of the multiplier 40 shown in FIG. 7A, the multiplier 40 shown in FIG. 7B includes a second variable delay units group which consists of a plurality of variable delay units 108-1~108-3 (to be collectively referred to as 108), and a wave adder 110.

The plurality of variable delay units 108 are connected by cascade connection, the delay time of each variable delay units 108 is set to be substantially the same as each of the variable delay units 94, and the high frequency clock generated by the OR circuit 106 is delayed and output sequentially. The number of the connected variable delay units 108 is the same as the number of the connected variable delay units 94.

The wave adder 110 adds the waves of the signals output from the variable delay units 108 of the second variable delay units group. In this example, the wave adder 110 adds waves of the inverted signals of the high frequency clock output from the OR circuit 106 and the even number variable delay unit 108, and the waves of the high frequency clock output from the odd number variable delay unit 108, and outputs a high frequency clock. Thereby, the timing of each edge of the high frequency clock can be defined based on the average of the delay time in the plurality of variable delay units (94,108) in the first variable delay units group and the second variable delay units group. That is, the jitter of the high frequency clock caused by the variation in the delay time in the variable delay units (94,108) can be reduced.

In this example, the variable delay unit 108-1 (a fourth variable delay unit) delays the high frequency clock output from the OR circuit 106 for ¼ cycle of the delay clock and outputs the delay clock. Moreover, the variable delay unit 108-2 (a fifth variable delay unit) delays the high frequency clock output from the variable delay unit 108-1 for ¼ cycle of the delay clock and outputs the delay clock. The variable delay unit 108-3 (a sixth variable delay unit) delays the high frequency clock output from the variable delay unit 108-2 for ¼ cycle of the delay clock and outputs the delay clock. Then, the wave adder 110 adds the waves of the inverted signals of the high frequency clocks output from the OR circuit 106 and the variable delay unit 108-2 and the wave of the high frequency clocks output from the variable delay unit 108-1 and the variable delay unit 108-3, and outputs the signal, of which the jitter of the high frequency clock is reduced.

Figure 7C:
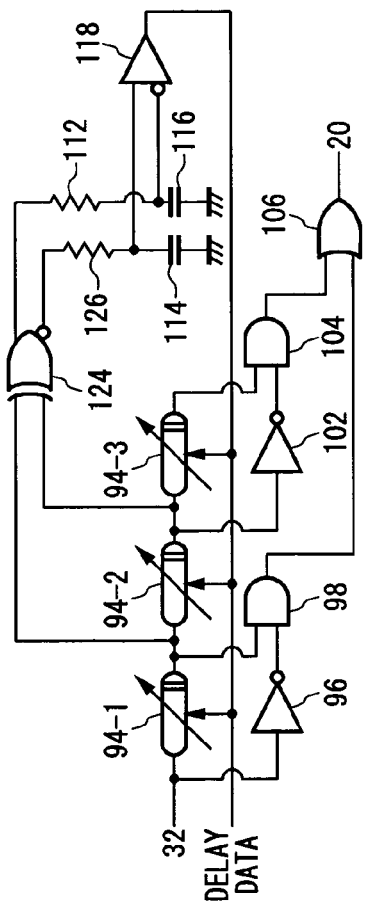
FIG. 7C is a circuit diagram showing yet another example of the configuration of the multiplier.

FIG. 7C is a circuit diagram showing yet another example of the configuration of the multiplier 40. In addition to the configuration of the multiplier 40 shown in FIG. 7A, the multiplier 40 in FIG. 7C further includes an exclusive OR circuit 124, a resistor 126, a resistor 112, a capacitor 114, a capacitor 116, and an error amplifier 118.

The exclusive OR circuit 124 outputs the exclusive OR of the delay clock input into one of the variable delay units 94 of the first variable delay units group, and the delay clock output from another variable delay unit 94 located downstream of the above-mentioned variable delay unit 94, the other variable delay unit 94 being connected to the above-mentioned variable delay unit 94. In this example, the exclusive OR circuit 124 outputs the exclusive OR of the delay clock to be input into the variable delay unit 94-1, and the delay clock output from the variable delay unit 94-2. The delay time of each variable delay unit 94 is set as ½ cycle of the high frequency clock to be generated, and delays the delay clock sequentially. Therefore, the exclusive OR circuit 124 generates a signal, of which the frequency is substantially the same as the high frequency clock to be generated, by generating the exclusive OR of the signal input into one of the variable delay units 94, and the signal output from the above-mentioned variable delay unit 94.

Moreover, the exclusive OR circuit 124 further outputs the inverted signal of the generated signal. The resistor 126 and the capacitor 114, and the resistor 112 and the capacitor 116 constitute integrating circuits, respectively, and perform the same operation as the resistor 84, the resistor 86, the capacitor 88, and the capacitor 90 explained with reference to FIG. 6. That is, the voltage of a level according to the duty ratio of the non-inverted signal output from the exclusive OR circuit 124 and the inverted signal is supplied to the error amplifier 118, respectively. The error amplifier 118 sets the delay time of all the variable delay circuits 94 as a delay time with which the duty ratio of the signal output from the exclusive OR circuit 124 may become 50% like the error amplifier 82 explained with reference to FIG. 6.

By configuring the property of the variable delay circuits 94 identically with one another, the delay time of each variable delay unit 94 can be controlled, and the high frequency clock, of which the duty ratio is 50%, can be generated with sufficient accuracy.

Figure 8:
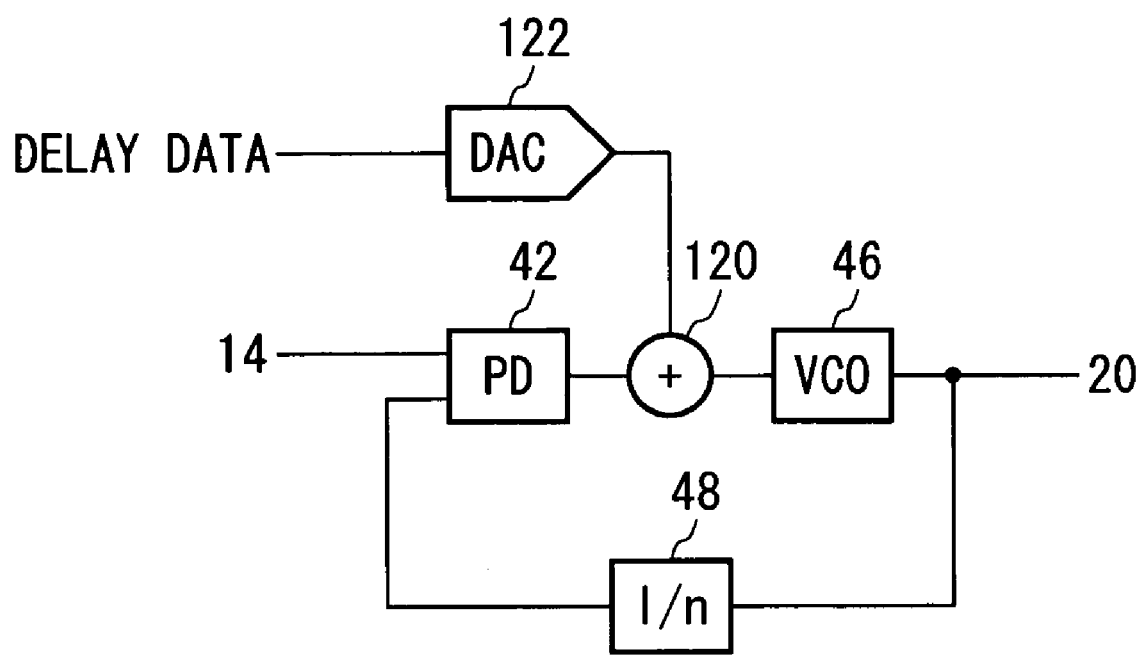
FIG. 8 is a block diagram showing another example of the configuration of the high frequency delay circuit.

FIG. 8 is a block diagram showing another example of the configuration of the high frequency delay circuit 30. The high frequency delay circuit 30 in this example generates a high frequency clock delayed for a desired delay time using the configuration of the PLL explained with reference to FIG. 2. The high frequency delay circuit 30 in this example includes a phase comparator 42, a voltage superpose section 120, a digital-to-analogue converter 122, a voltage controlled oscillator 46, and a divider 48. The function of the phase comparator 42, the voltage controlled oscillator 46, and the divider 48 is substantially the same as that of the phase comparator 42, the voltage controlled oscillator 46, and the divider 48 explained with reference to FIG. 2.

The phase comparator 42 receives the reference clock, of which the frequency is lower than the high frequency clock, from the jitter reduction circuit 14, and outputs a control voltage according to the phase difference between the reference clock and the comparison signal received from the divider 48.

The delay data, indicating a voltage value according to a desired delay time by which the high frequency clock is to be delayed, are supplied to the digital-to-analogue converter 122 as digital data, and supplies the delay voltage, in which the delay data are converted into the analogue voltage, to the voltage superpose section 120. The voltage superpose section 120 outputs the superpose voltage, which is the control voltage output from the phase comparator 42 being superposed with the delay voltage.

The voltage controlled oscillator 46 generates the high frequency clock having a frequency according to the superpose voltage, and output it. That is, since the control voltage supplied to the voltage controlled oscillator 46 is superposed with the delay voltage according to desired delay data, the voltage controlled oscillator 46 can generate the high frequency clock delayed for the desired delay time, which cannot be accomplished with the high frequency clock generated when the delay voltage is not superposed.

Moreover, the divider 48 divides the high frequency clock generated by the voltage controlled oscillator 46, generates a signal of which the frequency is substantially the same as the reference clock, and inputs it into the phase comparator 42 as a comparison signal. With such the configuration, the high frequency clock delayed for the desired delay time is easily generable.

Although the present invention has been described by way of exemplary embodiments, it should be understood that many changes and substitutions may be made by those skilled in the art without departing from the spirit and the scope of the present invention which is defined only by the appended claims.

What is claimed is:

1. A high frequency delay circuit operable to output a high frequency signal delayed for a desired delay time, comprising:
   a variable delay circuit operable to receive a reference signal of which a frequency is lower than the high frequency signal, and to output a delay reference signal delayed from the reference signal for the desired delay time in advance; and
   a multiplier operable to generate the high frequency signal, of which a frequency is a frequency of the delay reference signal multiplied by a predetermined value, and to output the generated high frequency signal at timing according to a phase of the delay reference signal,
   wherein said multiplier comprises:
   a pulse width extension circuit operable to output logical sum of the delay reference signal and a signal, which is the delay reference signal delayed for a delay time shorter than a pulse width of the delay reference signal, as a pulse width extension signal; and
   a multiplication circuit operable to output logical product of the pulse width extension signal and a signal, which is an inversion of the pulse width extension signal delayed for a predetermined delay time, as the high frequency signal.

2. The high frequency delay circuit as claimed in claim 1, wherein said multiplier comprises:
   a first variable delay units group including a plurality of variable delay units, wherein a delay time of each of said variable delay units is set to be ½ cycle of the high frequency signal to be generated, said variable delay units sequentially delay the delay reference signal and output it, and said variable delay units are connected by cascade connection; and
   a plurality of AND circuits operable to generate logical products of inverted signals of signals output from even number variable delay units out of said plurality of variable delay units, and signals output from odd number variable delay units out of said plurality of variable delay units; and
   an OR circuit operable to output logical sum of signals output from said plurality of AND circuits as the high frequency signal.

3. The high frequency delay circuit as claimed in claim 2, wherein said multiplier further comprises:
   a second variable delay units group including a plurality of variable delay units, wherein a delay time of each of said plurality of variable delay units of said second variable delay units group is set to be substantially the same as that of each of said plurality of variable delay units of said first variable delay units group, each of said plurality of variable delay units of said second variable delay units group sequentially delays the high frequency signal for ½ cycle of the high frequency signal and outputs it, and said plurality of variable delay units of said second variable delay units group are connected by cascade connection; and a wave adder operable to add waves of the signals output from said variable delay units of said second variable delay units group, and to define timing of each edge of the high frequency signal based on an average of delay times in said plurality of variable delay units of said first variable delay units group and said second variable delay units group.

4. The high frequency delay circuit as claimed in claim 3, wherein said multiplier further comprises:

a fourth variable delay unit operable to delay the high frequency signal output from said OR circuit for ¼ cycle of the delay reference signal and to output a fourth delayed signal;

a fifth variable delay unit operable to delay the fourth delayed signal for ¼ cycle of the delay reference signal and to output a fifth delayed signal;

a sixth variable delay unit operable to delay the fifth delayed signal for ¼ cycle of the delay reference signal and to output a sixth delayed signal; and a wave adder operable to add waves of signals output from said OR circuit, the fourth delayed signal, the fifth delayed signal, and the sixth delayed signal, and to output the high frequency signal, of which jitters are reduced.

5. The high frequency delay circuit as claimed in claim 2, wherein said multiplier further comprises:

an exclusive OR circuit operable to output an exclusive OR of the delay reference signal input into one of said variable delay units of said first variable delay units group, and the delay reference signal output from the above-mentioned variable delay unit; and a duty comparator operable to detects a duty ratio of the signal output from said exclusive OR circuit, and to control a delay time of each of said variable delay units so that the detected duty ratio may become about 50%.

6. The high frequency delay circuit as claimed in claim 1, wherein said high frequency delay circuit outputs the high frequency signal, of which a frequency is double precision of the frequency of the reference signal, and said multiplier comprises:

a first variable delay unit operable to delay the delay reference signal for ¼ cycle of the delay reference signal and to output a first delayed signal;

a second variable delay unit operable to delay the first delayed signal for ¼ cycle of the delay reference signal and to output a second delayed signal;

a third variable delay unit operable to delay the second delayed signal for ¼ cycle of the delay reference signal and to output a third delayed signal;

a first AND circuit operable to output logical product of an inverted signal of the delay reference signal, and the first delayed signal;

a second AND circuit operable to output logical product of an inverted signal of the second delayed signal, and the third delayed signal; and an OR circuit operable to output logical sum of a signal output from said first AND circuit, and a signal output from said second AND circuit, as the high frequency signal.

7. The high frequency delay circuit as claimed in claim 6, wherein said multiplier further comprises:

an exclusive OR circuit operable to output an exclusive OR of the delay reference signal to be input into one of said first to third variable delay units, and the delay reference signal output from said one of said first to third variable delay units; and a duty comparator operable to detect a duty ratio of the signal output from said exclusive OR circuit, and to set a delay time of said first variable delay unit, said second variable delay unit, and said third variable delay unit so that the detected duty ratio may become about 50%.

* * * * *